United States Patent [19]
Murley, Jr.

[11] 3,944,874
[45] Mar. 16, 1976

[54] SOLID STATE MULTIPHASE HIGH VOLTAGE GENERATOR

[75] Inventor: Ellsworth M. Murley, Jr., Toledo, Ohio

[73] Assignee: Owens-Illinois, Inc., Toledo, Ohio

[22] Filed: Aug. 28, 1968

[21] Appl. No.: 755,930

[52] U.S. Cl. ............ 315/169 TV; 330/13; 330/17; 330/20
[51] Int. Cl.² ........................................ H05B 41/24
[58] Field of Search ......... 315/169 TV; 330/14, 17, 330/13, 30, 28; 307/270, 313

[56] References Cited
UNITED STATES PATENTS

| | | | |
|---|---|---|---|
| 3,078,379 | 2/1963 | Plogstedt et al. | 330/14 X |
| 3,246,251 | 4/1966 | Sheppard | 330/14 |
| 3,259,848 | 7/1966 | Rado | 330/14 |
| 3,487,320 | 12/1969 | Heidecker et al. | 330/13 |
| 3,499,167 | 3/1970 | Baker et al. | 315/169 |
| 3,559,190 | 1/1971 | Bitzer et al. | 315/169 UX |

OTHER PUBLICATIONS

Bernays, "Extend Audio-Amplifier Preformance", *Electronic Design* 6, Mar. 14, 1968.

Herscher, "Designing Transistor A-F Power Amplifiers", *Electronics*, Vol. 31, No. 15, (Apr. 11, 1958), pp. 96–99.

*Primary Examiner*—William D. Larkins
*Attorney, Agent, or Firm*—Donald Keith Wedding

[57] ABSTRACT

A multiphase high voltage, high power, solid state generator having a pair of 180° out of phase periodic voltage waveforms, undistorted by variation in nonlinear loading, primarily for use as a sustaining voltage source for conductor arrays on a gas discharge display panel. The output of a low voltage oscillator is fed to a phase splitter driver circuit which incorporates complementary emitter follower transistors to provide push-pull output power for each phase split voltage. At least a pair of back-to-back complementary power amplifiers having a common ground or reference point are driven by the 180° out of phase voltages, respectively, of the phase splitter driver circuit. Distortion due to nonlinear loading is reduced by several feedback loops in each complementary amplifier of the back to back pair. Consult the specification for further details and features.

12 Claims, 5 Drawing Figures

SOLID STATE MULTIPHASE HIGH VOLTAGE GENERATOR

This invention relates generally to high voltage, high power two phase solid state voltage generators, and more particularly to apparatus for generating a pair of periodic high voltages which are 180° out of phase with respect to each other, one of which is positive with respect to ground or reference and the other of which is negative with respect to ground or reference and both of which are balanced with respect to each other and ground and free of distortion due to variation in loading.

Objects of the invention include: provision of an improved high voltage, low distortion generator for producing periodic voltages; provision of a solid state, transformerless high voltage generator free of distortion due to variation in nonlinear loading; provision of an improved sustaining voltage generator system for a gas discharge panel; and, the provision of an improved generator for generating a pair of high voltage, high power 180° out of phase voltages.

The above objects of the invention are achieved by supplying a periodic voltage from an oscillator, for example, to a phase splitter circuit, each output of which is first amplified by a pair of complementary symmetry emitter-follower amplifiers to produce two voltages which are 180° out of phase with respect to each other but both of which are above ground or a referenced potential. These two voltages are applied as the input voltages to a pair of back to back complementary amplifiers each of which incorporates high voltage output transistors. The ground or reference connection between the back to back pair is common to each amplifier, respectively. Moreover, the output of each amplifier of a back-to-back pair has compound (Darlington connected) emitter-follower push-pull output stages with a split resistance between the emitters the nodal point between resistors defining a reference point above or below, respectively, ground. For example, with respect to a positive 200 volt direct current supply for one amplifier of the back-to-back pair the output reference point for that amplifier may be positive 100 volts and with a negative 200 volts supply for the other amplifier of the back-to-back pair, the referenced point will be negative 100 volts. Each out of phase periodic voltage then has its waveform excursions above and below the reference established therefor, e.g. the negative 100 volts or the positive 100 volts. A number of distortion eliminating feedback circuits are incorporated in each back-to-back amplifier.

Any number of back-to-back amplifiers may be connected to the phase splitter driver outputs to thus provide a plurality of voltages precisely related in phase and thus drive separate sections of a multielement load, as for example a gas discharge panel.

The above and other objects, advantages and features of the invention will be better understood in connection with the accompanying drawings wherein.

Figure 1:
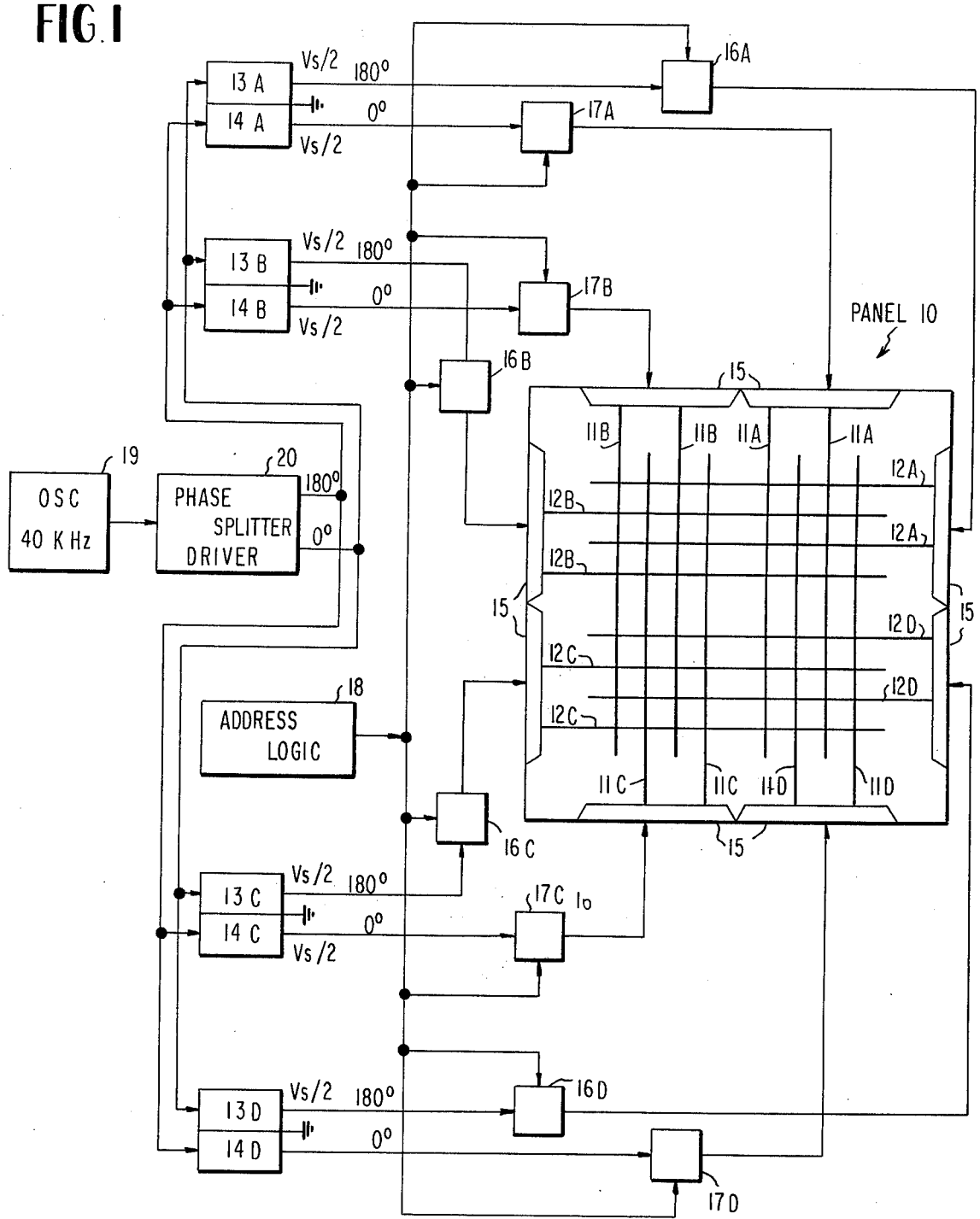
FIG. 1 is a block diagram incorporating the invention.

With reference now to the drawings, FIG. 1 discloses a block diagram of the sustaining generator of the present invention as applied to a gas discharge panel 10 having orthogonally related conductor arrays 11 and 12 of the type disclosed in Baker et al U.S. Pat. No. 3,499,167 and entitled "Gas Discharge display-memory Device and Method." Each conductor of conductor arrays 11 and 12 is supplied with a sustaining voltage from one-half of sustaining voltage $V_s$ from amplifiers 13 (A, B, C and D) and 14 (A, B, C and D), respectively, the output voltages of each amplifier 13 and 14 being 180° out of phase with respect to each other so that one-half of the voltage $(V_s)/2$ is applied to conductors of conductor array 11 and one-half of the sustaining voltage is applied to conductors of conductor array 12. The conductor arrays are shown as groups A, B, C and D, the groups being interleaved to facilitate individual electrical connection to the conductors of the group via connector strips 15. Although there is shown only one pulsing or discharge manipulation circuit (16 or 17) connected to a conductor group, there is an individual pulsing circuit for each conductor of a group although it is evident that several conductors may be connected to a common pulse circuit. Back-to-back amplifier pairs 13 and 14 bear letters corresponding to the conductor groups to which they are connected for supplying sustaining voltage, a single amplifier unit being common to the plurality of conductors within a group. As disclosed in the aforementioned Baker et al patent, sustaining voltage $V_s$ is insufficient to effect discharge manipulation at any cross-point between pairs of conductors of conductor array 11 and 12 unless a cross-point defined by such conductors has been previously discharged to form charges stored on dielectric surfaces in panel 10. Discharge manipulation (initiating and terminating discharges) of selected cross-points of conductor arrays 11 and 12 is effected by means of an interface circuitry comprising pulse sources 16 and 17, respectively which may be of the type disclosed in Johnson U.S. Pat. No. 3,513,325. As diagrammatically illustrated, pulse sources 16 and 17 are triggered by application of a logic pulse from an addressing logic circuit 18. The operation is such that selective transmission of logic pulses or control signals from address and logic circuit 18 to selected pulse circuits 16 and 17, respectively, produce a high unidirectional voltage pulses which are added to the sustaining voltages from sustaining voltage sources 13 and 14 and such combined voltages are of sufficient magnitude to manipulate the discharge condition of a discharge unit defined by the selected conductors.

Figure 2:
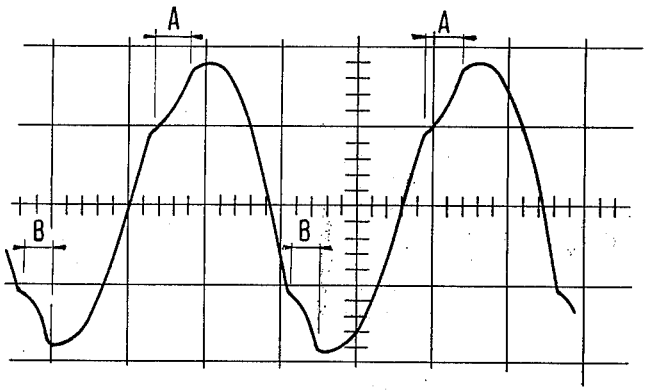
FIG. 2A and FIG. 2B are waveform diagrams illustrating the distorted output of a 500 watt sustaining generator driving a gas discharge display panel and a waveform of the generator of the present invention driving a similar panel, respectively.
Figure 2:
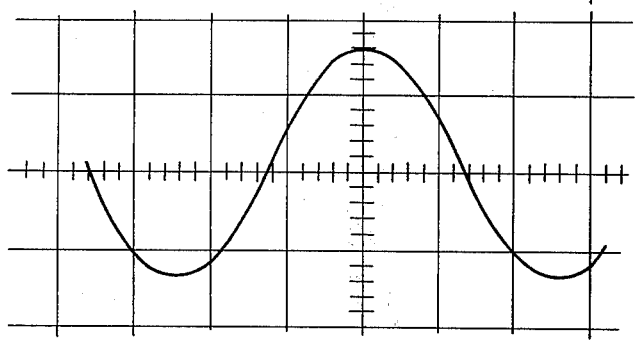

The present invention is concerned with the sustaining voltage generator constituted by oscillator 19, phase splitter-driver 20 and amplifiers 13 and 14. As mentioned earlier, when a number of discharge units have been fired, e.g. discharged by the application of firing voltages thereto, they are maintained in a fired or discharged condition by the sustaining voltage from the sustaining voltage generator. In a standard panel there may be many thousands of discharge units in a single panel. For example, in a four inch panel having conductors of conductor arrays 11 and 12 spaced on 30 mil centers, there may be approximately 17,000 discharge units or cross-points. Prior to the present invention, such panels have been driven from sustaining generators of the tube and/or transformer type having high power output tubes and yet firing of a large number of such discharge units simultaneously from the same sustaining generator source can cause a distortion in the wave shape of the sustaining voltage. It is known that the sustaining voltage waveform shape, e.g. the slope particularly at the desired time of discharge can effect the memory characteristics of such panels. As shown in FIG. 2A, a sustaining voltage waveform from an earlier generator where a relatively large number of discharge units of the panel have been sustained in the firing condition there is a distortion in the sustaining voltage waveform at the firing point. It is with respect to the limitation or elimination of this distortion and to provide a solid state sustaining generator that the present has particular utility but it will be understood that the generator of the present invention may be used in other environments where there is need for high voltage multiphase waveforms.

Figure 3:
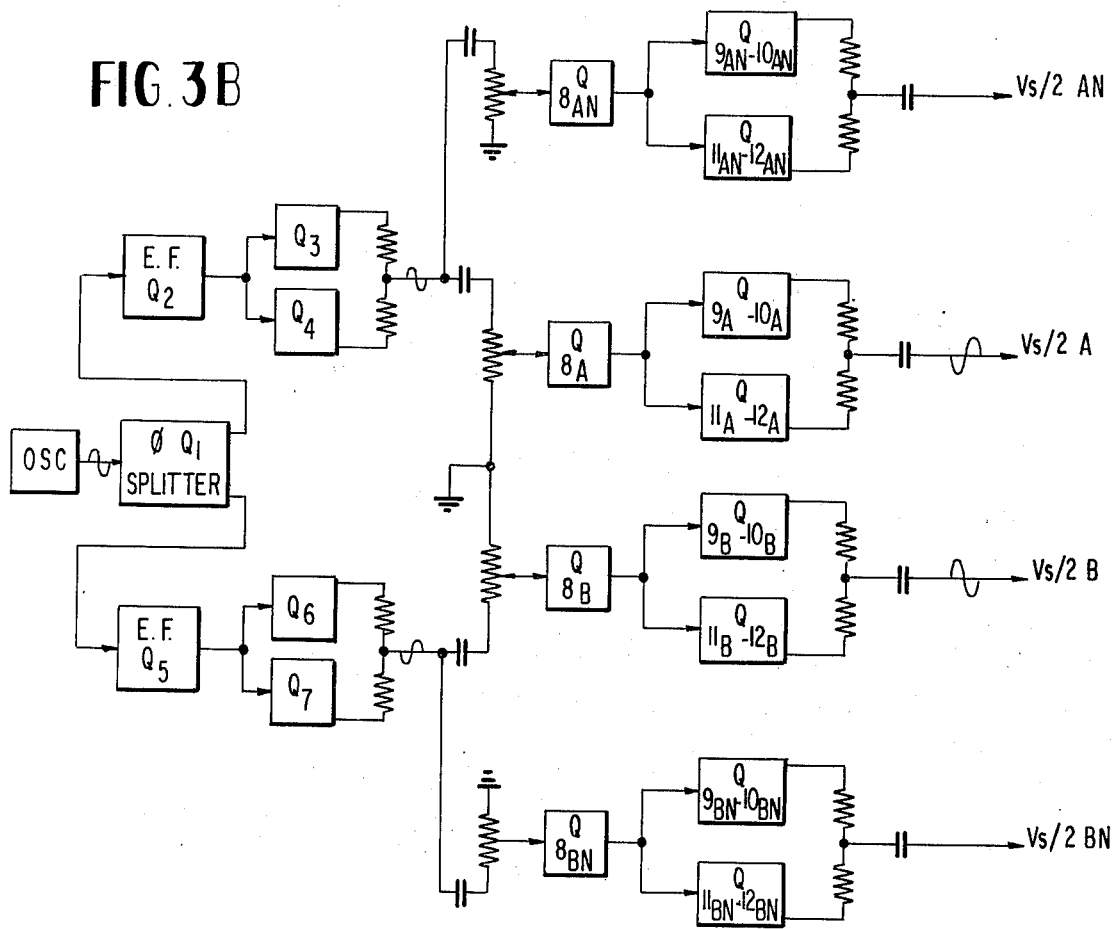
FIG. 3A is a schematic diagram of a circuit incorporating the invention.
FIG. 3B is a block diagram illustrating an adaptation of the invention corresponding in part to FIG. 1 to disclose the manner of deriving a plurality of precisely related phase voltages, for driving a gas discharge display panel for example.
Figure 3A:
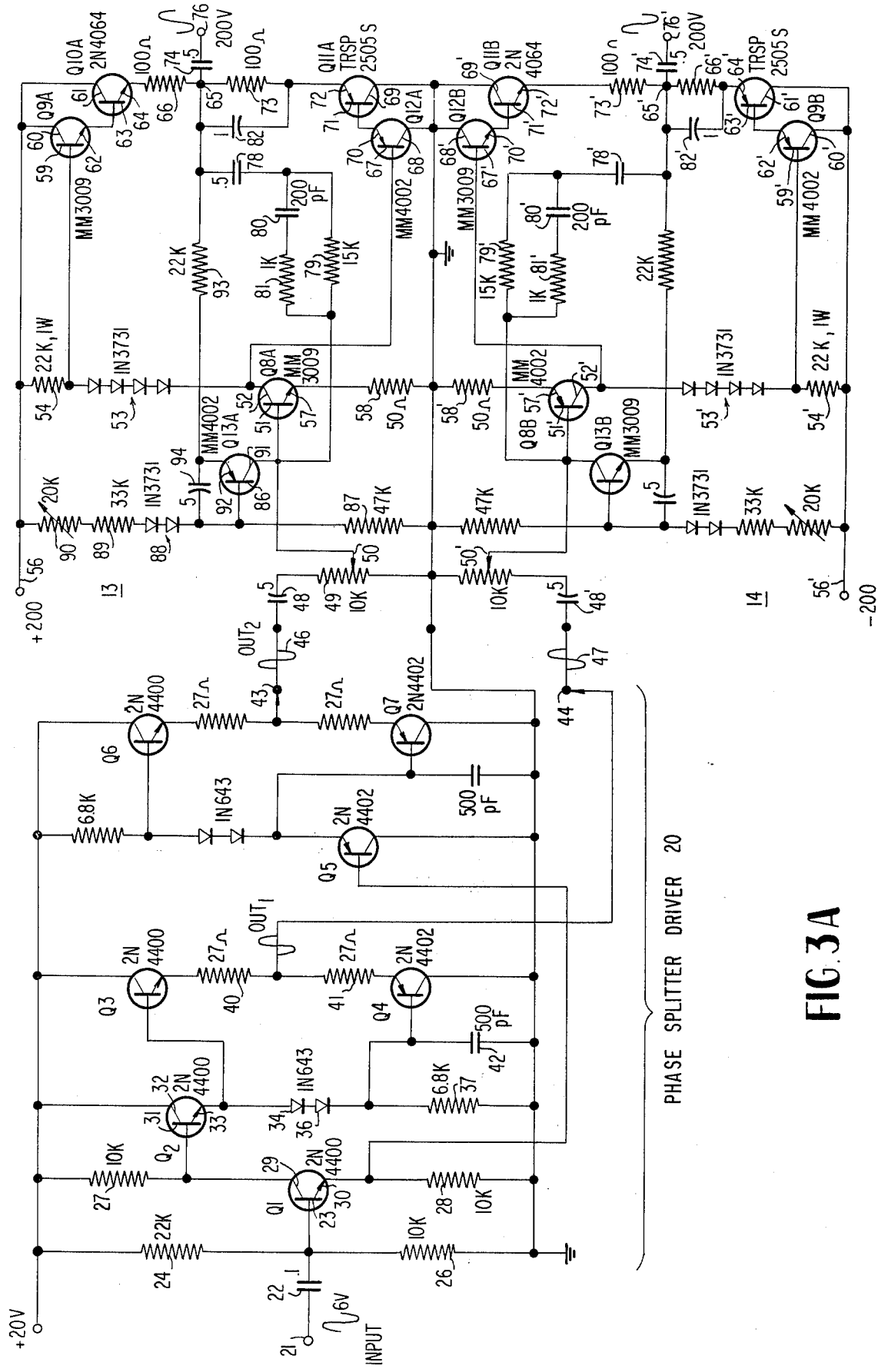

With reference now to FIG. 3A, the output of oscillator 19 which may be conventional low voltage oscillator, signal generator, etc. is applied to input terminal 21 of phase splitter-driver circuit 20. This sinusoidal voltage is coupled through coupling capacitor 22 to the base 23 of phase-splitter transistor Q1. Resistors 24 and 26 provide bias potential to the base 23 of transistor Q1. Collector resistor 27 develops one output signal of phase splitter transistor Q1 and emitter resistor 28 develops a second output. Conventionally, collector resistor 27 and emitter resistor 28 are of equal value and the signal current flows through both resistors so that when the input to base electrode 23 aids the forward bias (the base becomes more positive) the current through the phase splitter transistor Q1 and resistors 27 and 28 increases and this increase causes collector 29 of transistor Q1 to become more negative with respect to ground and emitter 30 of transistor Q1 to become more positive with respect to ground. When the input signal opposes the forward bias (the base becomes more negative) on the base of transistor Q1, the current decreases and causes relative reverse polarity at resistors 27 and 28 respectively. This conventional circuit action produces two output signal voltages that are 180° out of phase with respect to each other.

The signal voltage at collector 29 of transistor Q1 is coupled directly to base 31 of transistor Q2 which is essentially an emitter-follower transistor with collector 32 being connected directly to the source of positive potential and emitter 33 being connected through temperature compensating diodes 34 and 36 and resistor 37 to ground. Transistors Q3 and Q4 are essentially connected as complementary push-pull output stages with transistor Q3 carrying the load on the positive half cycle and transistor Q4 carrying the load on the negative half cycle. Emitter resistors 40 and 41 are small resistors and have equal value to provide a balanced output.

The out of phase signal as developed across resistor 28 in the emitter 30 of transistor Q1 is applied to a second stage corresponding to transistors Q2, Q3, Q4, the second stage being constituted by opposite conductivity transistor Q5, and push-pull transistors Q6 and Q7 so that there appears at the output terminals 43 and 44 of phase splitter-driver circuit 20 two voltages 46 and 47 which are precisely 180° out of phase with respect to each other. These voltages 46 and 47 are diagrammatically illustrated on the lines leading into the input to the back-to-back amplifiers 13 and 14.

Except for being comprised of transistors of alternate conductivity types, amplifiers 13 and 14 are identical in all respects so only amplifier 13 will be described in detail, it being understood that the same description applies to amplifier 14 (corresponding elements being identified by primed numerals or the letter "B"). While amplifier 13 will be described in its connection with the present invention, a more detailed description is found in a two part article entitled "Extended Audio-Amplifier Performance" appearing in the March and April 1968 issues of *Electronic Design*. Voltage waveform 46 appearing at terminal 43 is coupled through a direct current blocking alternating current coupling capacitor 48 to potentiometer 49, the wiper 50 of potentiometer 49 being connected directly to base 51 of amplifying transistor Q8A which has an active direct current bias network, including transistor Q13A, which is described more fully hereinafter. Collector 52 of transistor Q8A is connected through temperature compensating diode string 53 and collector load resistor 54 to a source of high (above 200 volts) positive potential on line 56 and emitter 57 is connected through emitter feedback resistor 58 to ground or a common reference point. Unbypassed resistor 58 provides degenerative current feedback at the emitter 57 of transistor Q8 to reduce parasitic oscillations.

The contact potential drop across temperature compensating diode chain 53 is, for practical purposes, insignificant so that the output signal voltage at collector 52 of transistor Q8A is applied to the base electrode 59 of transistor Q9A which is in compound or Darlington connection with transistor Q10A. Thus, collector 60 of transistor Q9A and collector 61 of transistor of Q10A are both directly connected to the high voltage line 56 whereas emitter 62 of transistor Q9A is connected directly to base 63 of transistor Q10A and the emitter 64 of transistor Q10A is connected through a small resistor 66 to an intermediate or nodal point 65. The output voltage at collector 52 of transistor Q8A is also applied directly to base 67 of transistor Q12A which, like transistor Q9A is compound or Darlington connected with transistor 11A, Thus, collector 68 of transistor Q12A and collector 69 of transistor Q11A are both directly connected to ground or reference and emitter 70 of transistor Q12A is directly connected to base 71 of transistor Q11A. Emitter 72 of transistor Q11A is connected through resistor 73 to intermediate or nodal point 65.

As thus far described, it will be recognized that amplifier circuit 13 consists of a direct coupled amplifier having direct coupled complementary symmetry emitter followers connected in push-pull relation, such emitter followers being constituted by transistor pair Q9A–Q10A of one conductivity type and transistor pair Q11A–Q12A of opposite conductivity types, respectively with emitter resistors 61 and 73 being of equal value too provide a balanced output.

As shown, Darlington pair constituted by transistors Q9A and Q10A are of the NPN conductivity type and the Darlington pair constitited by transistors Q11A and Q12A are of the PNP type so that the signal output appearing at intermediate point 65 and coupled through coupling capacitor 74 to output terminal 76 has its first half (negative half) cycle produced upon the positive half cycle of input signal 46 opposing the forward bias on the base of base 51 of PNP transistor Q8A. The negative signal voltage at collector 52 is applied to base 59 of transistor Q9A and opposes the forward bias on base 59 to cause transistor pair constituted by transistors Q9A and Q10A to reduce their conduction. The negative half cycle of input signal 46 aids the forward bias on base 51 of transistor Q8A to increase the conduction current through transistor Q8A and cause an increase in the voltage at collector 52. This positive going half cycle at collector 52 is applied to base 67 of transistor Q12AA to cause the transistor pair constituted by transistors Q11A and Q12A to conduct more and thus produce the positive half cycle at intermediate point 65 which is coupled to output terminal 76 through capacitor 74. As thus described, the output stage operates in push-pull manner with transistor pair Q9A and Q10A carrying the load on the positive half cycle of input signal voltage 46 and transistor pair Q11A and Q12A carrying the load on the negative half cycle of input signal voltage. The emitter-follower action of the push-pull output stage sets the limit on the output voltage swing.

In the absence of an alternating current signal voltage 46, the collector current of transistor Q8A sets the voltage at intermediate point 65 at approximately half the supply voltage or with a 200 volt supply at about 100 volts and the direct coupling between collector 52 of transistor Q8A and bases 59 and 67 of transistors Q9A and Q12A permits transistor Q8A to act as a DC amplifier as well as an alternating current signal amplifier. Hence, any variation in the bias of transistor Q8A varies the collector current which upsets the quiescent operating condition of transistor pair Q9A-Q10A with respect to transistor pair Q11A and Q12A. This problem has been solved in the prior art by the addition of a transistor bias amplifier such as transistor bias amplifier Q13A.

Frequency response for the amplifier is achieved through alternating feedback circuit constituted by capacitor 78 and resistor 79 in a conventional manner. In order to adapt the circuit for use with a gaseous discharge dislay panel, an additional high frequency feedback circuit is included in the loop constituted by capacitor 80 and resistor 81. To this same end, and to reduce distortion, a relatively large capacitor 82 was added across resistor 73. With circuit component values as shown in FIG. 3A, the bandwidth of the circuit extends to about 50 KH$_z$ and the input sinusoidal voltage is chosen to be about 40 KH$_z$. Although it is desirable that the frequency of input from oscillator 19 be relatively stable, it is apparent that this is not critical.

Shift in the bias of transistor Q8A is eliminated by the active bias network constituted by transistor Q13A. Initial bias potential for base 86 of transistor Q13A is provided by the voltage divider consisting of resistor 87, a pair of diodes 88, resistor 89 and variable resistor 90. Variable resistor 90 is provided to adjust the quiescent level of the bias potential on base 86 and diodes 88 are included to maintain tracking between a selected reference voltage and the emitter-base contact potential of transistor Q13A over the design temperature range. Collector 91 of transistor Q13A is connected directly to base 51 of transistor Q8A and emitter 92 is connected through resistor 93 to intermediate point 65 between the emitter-follower transistor pairs Q9A-Q10A and Q11A-Q12A. Capacitor 94 is connected between emitter 92 and base electrode 86 to provide a clamping action to prevent transistor Q13A from developing undesirable feedback when an alternating current signal is applied. This capacitor has no effect on compensation for long term changes, such as supply voltage variations and temperature shifts. When no AC signal is present, the base current for transistor Q8A consists almost entirely of the collector current of transistor Q13A. When there is a variation in supply voltage, for example, the junction between the cathode of the lower most diode, diodes 88 and resistor 87, which is connected directly to the base of 86 of transistor Q13, assumes a new reference potential in the same percentage as originally set. If the supply voltage is increased the voltage at intermediate point 65 will increase causing current to flow through resistor 93 and into capacitor 94 at a rate determined by the time constant of resistor 93, capacitor 94, resistors 89 and 90 and resistor 87 which, in turn causes the voltage across the emitter base junction of transistor Q13 to increase causing an increase in base current to transistor Q8A. This, in turn, increases the collector current in transistor Q8A until the voltage drop across resistor 54 is increased to return the quiescent operating point to the set percentage of the output supply voltage. A decrease in supply voltage will initiate a reverse sequence to restore the ultimate quiescent voltage. Temperature sensitive parameter variations in transistor Q8A and the Darlington transistor pairs constituted by transistors Q9A-Q10A and Q11A-Q12A which cause changes in the quiescent voltage will also be sensed and corrected by transistor Q13A in a similar manner.

With respect to alternating current signals, the instantaneous alternating current output voltage is divided between resistor 93 and the combined parallel impedance of resistor 89–90 and 87 and the emitter base voltage drop across transistor Q13A remains clamped by capacitor 94 to thus maintain the collector current of transistor Q13A essentially constant even when the output voltage is swung from the positive to the negative extremes.

Except for the provision of emitter resistor 58, high frequency feedback circuit consisting of resistor 81 and capacitor 80, making resistors 66 and 83 two resistors instead of one to provide a balanced output and the provision of distortion reducing capacitor 82, the amplifier circuit 13 constituted by transistors Q8A-Q13A is essentially in the prior art insofar as the present invention is concerned. The additional elements included herein for purposes of reducing distortion and providing balanced output and the addition of a complementary transistor amplifier 14, identical in all respects to amplifier 13 except being of opposite conductivity type transistors to provide balanced 180° out of phase signals is unique with this invention. As diagrammatically illustrated in FIGS. 3A and 3B, a number of pairs of back-to-back transistor amplifiers corresponding to back-to-back transistor amplifier pairs 13 and 14 may be added for driving different portions of a gas discharge panel, for example, with assurance that the output voltage potentials for precisely 180° out of phase with respect to each other and balanced and of substantially undistorted waveform. The compound connection of transistors, as for example transistors Q9A, Q10A, assures highly efficient operation.

The additional feedback loops constituted by capacitor 80 and resistor 81, emitter feedback constituted by the addition of resistor 58 and the elimination of distortion by the addition of capacitor 82 effect a substantial reduction in distortion because of variation in the nonlinear load of a gas discharge panel as more or less cross-points or discharge units are sustained in a fired condition.

An important aspect of the invention is that the voltage generator is compact, light in weight and low in distortion and, at the same time may be made in solid state form, even using integrated circuitry. Moreover, use of this type of circuit allows the maximum use, without distortion of the available supply voltage. It is possible to achieve 170 volts peak-to-peak output using the 200 volts supply shown. With the back-to-back arrangement of complementary stages 13 and 14, 340 volt peak-to-peak output can be obtained using 200 volt output transistors. This generator provides the necessary sinusoidal voltage amplitude without resorting to the use of output transformers or high voltage circuits.

Another important aspect of the invention is that the load "floats" with respect to ground so that pulse voltages derived from low level control signals need not be referred to any high voltage supply but only with respect to the output voltage waveforms at output terminals 76 and 76'. Additionally, since the ground is common to back-to-back amplifiers 13 and 14, respectively, and since intermediate points 65 and 65' are set at a DC voltage level midway between the positive and negative supplies, respectively, the amplitude of each output voltage may be adjusted by adjusting resistors 49 49', respectively and the quiescent voltage levels may be varied by adjusting resistors 90, 90', respectively. Any number of back-to-back amplifiers may be connected to the phase splitter-driver circuit 20 to provide a plurality of precisely phase related output voltages for driving different sections or banks of conductor arrays in the same or companion panels. Where the panel is a gas discharge panel of the type disclosed in the aforementioned Baker et al patent application, the gas therein should be of a composition and pressure such that the 340 volt output of the circuit shown in FIG. 3A can drive same. To this end, the gas composition is preferably the neon-argon mixture as disclosed in Nolan application Ser. No. 764,577 filed Oct. 2, 1968, now abandoned.

In the drawings, component values, and transistor and diode identifications are purely exemplary.

It is to be understood that the above described circuit is illustrative of a preferred embodiment and that numerous other and varied arrangements can readily be devised in accordance with the principles of the invention by those skilled in the art without departing from the spirit and scope of the invention.

What is claimed is:

1. A balanced, solid state high voltage, high power, low distortion generator for supplying at least a pair of 180° out of phase voltages to row-column conductor arrays, respectively, in a gas discharge display panel comprising, in combination,
 a source of a pair of low voltage periodic voltages 180° out of phase with respect to each other,
 a parallel pair of complementary push-pull transistor amplifiers, one of said push-pull transistor amplifiers of said pair being connected to receive one of said low voltage periodic voltages, and the other of said pair of push-pull transistor amplifiers being connected to receive the other of said low voltage periodic voltages,
 and at least a complementary pair of complementary high voltage transistor amplifiers connected back to back,
 means connecting the output voltage of one of said parallel pair of complementary push-pull amplifiers to one of said back-to-back pair, and the other output voltage of the other of said parallel pair of complementary push-pull amplifier to the other of said back-to-back pair,
 whereby the high output voltage of each amplifier of said back-to-back pair is 180° out of phase with respect to the other, with one of said output voltages being completely above ground reference and the other of said output voltages being completely below ground reference,
 and high unidirectional voltage pulse circuit means coupling said 180° out of phase output voltages to said row-column conductor arrays, respectively.

2. A solid state generator as defined in claim 1, wherein each amplifier of said back-to-back connected pair includes an output stage constituted by a complementary pair of emitter-follower stages connected in push-pull relation and wherein each said emitter-follower stage includes a compound connected transistor pair, and a resistor connected to the emitter connection of the compound connected pair, the resistors having a common connection to consistitute an output terminal of the push-pull stage.

3. The invention defined in claim 2, wherein said means connecting the output voltages of said parallel pair of complementary push-pull amplifiers to said pair of back-to-back connected complementary transistor amplifiers includes resistor means for varying the amplitude of voltages applied to said back-to-back connected pair, respectively, to where the amplitudes of the output voltages from said back-to-back connected pair are equal and opposite with respect to ground.

4. The invention defined in claim 3, wherein each amplifier of said back-to-back connected pair includes an input transistor amplifier stage, and a high frequency feedback circuit from said output terminal of the push-pull stage to the input of said transistor stage.

5. The invention defined in claim 4, wherein said input transistor amplifier includes an unbypassed resistor in the emitter circuit thereof.

6. The invention defined in claim 1, including at least one further pair of back-to-back connected transistor amplifiers, corresponding amplifiers of each back-to-back connected pair being connected to receive the same phase of voltage from said means for producing at least two voltages 180° out of phase with respect to each other.

7. In a data display system, the combination comprising,
 a gas discharge display panel of the electrodeless discharge type in which transversely oriented, dielectrically coated, conductor arrays define a plurality of discharge sites in the panel, a gas discharge medium in the panel constituted by a gas mixture having a composition and pressure such that a pair of balanced discharge sustaining voltages applied to the conductors of said arrays, respectively, are low enough in magnitude to be supplied by a balanced solid state sustainer system,
 a balanced, high voltage solid state sustaining voltage supply system, said high voltage solid state sustaining voltage supply system comprising
 a. a source of low voltage level periodic voltage,
 b. circuit means connected to receive the output of said source of low voltage level periodic voltage and producing two periodic voltages displaced out of phase with respect to each other, c. a high direct current voltage source, d. and at least a pair of complementary transistor amplifiers connected back to back across said high direct current voltage source, each transistor amplifier of said pair including an output stage constituted by a complementary pair of emitter-follower stages connected in push pull relation with respect to the phase voltage applied thereto, respectively, means connecting the high output voltage from one of said pair of amplifiers to one conductor array and means connecting the high output voltage from the other of said pair of amplifiers to the other conductor array transversely oriented with respect to said first conductor array, and address voltage pulse means for selectively providing unidirectional voltage pulses algebraically combined with said sustaining voltage pulses for selective manipulation of the discharge condition of a discharge unit defined by selected conductor pairs in said conductor arrays, whereby a high voltage periodic output voltage of each amplifier of said pair of amplifiers is displaced out of phase with respect to the other to constitute the sustainer voltage to said gas discharge display panel, with one of said output voltages being completely above ground reference and the other of said output voltages being completely below ground reference and high unidirectional voltage pulse circuit means coupling said displaced out of phase output to said transversely oriented conductor arrays, respectively, so that said discharge panel electrically floats on said sustaining voltage supply system and each said address voltage pulse is selectively added to the sustaining voltage for selective manipulation of the discharge condition of discharge units to which said unidirectional voltage pulses have been algebraically combined.

8. The invention defined in claim 7, wherein conductors of said arrays are grouped and said system further including at least one further pair of back-to-back connected transistor amplifiers, corresponding amplifiers of each back-to-back connected pair being connected to receive the same phase of voltage from said phase splitter circuit, and means connecting the output voltages from said amplifiers to selected groups of conductors of said arrays.

9. The invention defined in claim 8, including means for equalizing the amplitudes of voltages applied to conductors of said array irrespective of the phases thereof.

10. The invention defined in claim 8, wherein each amplifier of a back-to-back pair of connected amplifiers includes high frequency feedback means to compensate for variation in nonlinear loading on the amplifiers as the number of discharge units sustained in a fired condition by said sustaining voltage increases.

11. The invention defined in claim 7, wherein each amplifier of said back-to-back connected pair of amplifiers includes feedback means to compensate for variation in nonlinear loading on said amplifiers when a large number of discharge units are sustained in a fired condition by said sustaining voltage.

12. The invention defined in claim 7, wherein each amplifier of said back-to-back connected pair includes means applying a feedback voltage proportional to the number of discharges in said multiple discharge gas panel.

* * * * *